(12) United States Patent
Kiani

(10) Patent No.: US 6,809,574 B1
(45) Date of Patent: Oct. 26, 2004

(54) BACK-DRIVE CIRCUIT PROTECTION FOR I/O CELLS USING CMOS PROCESS

(75) Inventor: Khusrow Kiani, Oakland, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 10/205,975

(22) Filed: Jul. 26, 2002

(51) Int. Cl.[7] .............................................. G05F 1/10
(52) U.S. Cl. ........................ 327/538; 327/540; 327/541
(58) Field of Search ................................. 327/379, 554, 327/538, 540, 541; 326/101, 83, 80, 86; 361/56, 91.1, 111, 118

(56) References Cited

U.S. PATENT DOCUMENTS 6,100,719 A * 8/2000 Graves et al. ................ 326/86
6,114,878 A * 9/2000 Loughmiller et al. ....... 326/101
6,144,251 A * 11/2000 Ogawa ........................ 327/544
6,150,843 A * 11/2000 Shiffer et al. ................. 326/80
6,307,399 B1 * 10/2001 Lien et al. ..................... 326/83

* cited by examiner

Primary Examiner—Tuan T. Lam
Assistant Examiner—Hiep Nguyen
(74) Attorney, Agent, or Firm—Jurgen Vollrath

(57) ABSTRACT

In a high tolerance I/O interface with over-voltage protection during 5V tolerant mode and back-drive mode, includes pass gate circuitry to isolate the output of the driver circuit and input of the receiver circuit from the pad voltage during stress mode. The gate voltage of the PMOS transistor of the pass gate is charged up to avoid gate oxide breakdown during stress mode. Also, the gate and well of the driver pull-up transistor are charged to NG1 to avoid current flow through the transistor and to its well.

15 Claims, 4 Drawing Sheets

US 6,809,574 B1

BACK-DRIVE CIRCUIT PROTECTION FOR I/O CELLS USING CMOS PROCESS

FIELD OF THE INVENTION

The invention relates to a method and system for providing back-drive circuit protection for I/O cells in a CMOS integrated circuit device.

BACKGROUND OF THE INVENTION

A typical integrated circuit device (IC) includes a core region 100, as illustrated in FIG. 1, and one or more functional elements or packages such as analog support/conversion circuitry 102. These are connected through an I/O interface 104 to pads 106 that allow the IC to be connected externally to other devices. The voltage levels vary for different portions of the IC, thus requiring special consideration to avoid exposing the various portions of the IC to excessive voltage levels. For instance, the core, I/O interface, and external circuitry to which the pads of the IC connect, typically will each support different voltages. Even within a typical CMOS core, voltages vary depending on the process used. For example, a 0.25 μm process supports voltage levels of the order of 2.5 V±10%; a 0.18 μm process supports voltage levels of the order of 1.8 V±10%; a 0.15 μm process supports voltage levels of the order of 1.5 V±10%, and a 0.13 μm process supports voltage levels of the order of 1.2 V±10%. In contrast, the I/O interface needs to support 3.3 V typically. For ease of understanding the input voltage levels to the core have been identified as VDD and VSS while those for the I/O interface are indicated as VDDIO and VSSIO. Furthermore, the pads may be connected to circuitry operating in the 5 V range. For example, where the IC drives a PCI bus, it is important that the IC can withstand the higher voltages of the system that it is supporting. In order to supply the higher voltage, a dual gate process involving the use of thick gate oxides is commonly used in the case of sub-micron CMOS.

The main concern arises under stress mode conditions when the pads are exposed to high voltages (approximately 5.5 V) by the external circuitry. Furthermore, different stress mode conditions may be identified. In particular, it is common to reduce VDD and VDDIO to 0V when the circuitry of the IC is not in use, thereby conserving energy.

An IC may typically be operated in one of three modes: (a) Normal mode, in which the core is powered up and drives the pads; (b) Tolerant mode, which is a stress mode in which the pads are raised up to 5.5 V, while the core and I/O interface are powered up (VDD and VDDIO are high); (c) Back-drive mode, which is a stress mode in which the pads are raised up to 5.5 V, while the core and I/O interface are powered down (VDD and VDDIO are low). Thus back-drive refers to the 5.5 V tolerant interface when there are no power supplies asserted. This condition becomes particularly important in the case of sub-micron CMOS, dual gate process technology in which the oxide breakdown and drain-source junction breakdown is about 3.8 V. Back-drive I/Os have to tolerate 5.5 V at the pads with and without power supplies asserted (commonly referred to as 5V tolerant level due to the 5V±10% tolerance). However, under stress mode, sub-micron dual gate devices tend to experience problems such as oxide breakdown, drain-source junction breakdown, current flow to VDDIO, and well charging due to the parasitic internal diode structure of CMOS devices.

FIG. 2 shows a simple I/O interface driver circuit comprising a p-channel (PMOS) pull-up transistor 200 and a n-channel (NMOS) pull-down transistor 210 which accommodate different load conditions under normal operation. When PMOS 200 is on and NMOS 210 is off, the load can be charged up to VDDIO. On the other hand, when PMOS 200 is off and NMOS 210 is on, the load can discharge to VSSIO. Thus the driver's output to the pad will, under normal operation, provide voltages ranging from VDDIO to VSSIO. Since VDDIO (3.3 V±10% under normal operation) is applied to both gates of the transistors 200, 210 one transistor will always be off, thereby avoiding shoot-through current through the driver transistors 200, 210.

However, under 5V tolerant mode and back-drive mode, the pad 212 is raised to 5.5 V. In order to avoid gate oxide breakdown the voltage drop from drain to gate must not exceed 3.8 V. Similarly, to avoid junction breakdown, the voltage drop from drain to source must not exceed 3.8 V. Furthermore, it is necessary to isolate the receiver input circuitry from the pad under these stress modes. Since, during stress mode the pad 212 cannot be driven by the pre-driver circuit, both transistors 200, 210 have to be turned off. Turning off the PMOS transistor 200 also avoids current flow from the pad 212 to VDDIO. The PMOS transistor is ideally turned off by tying the gate of PMOS 200 high relative to the high voltage node. However, when the pad voltage exceeds VDDIO by VTP, the PMOS will not shut off. The NMOS transistor, in turn, is turned off by applying a low voltage such as VSSIO to the gate of NMOS 210 relative to the drain.

In the circuit of FIG. 2, during 5V tolerant mode, when the gate of PMOS 200 is at VDDIO (i.e. about 3.3 V for 5V tolerant mode) the drain to gate voltage is 2.2 V and is thus less than the oxide breakdown voltage, which is about 3.8 V. However, this does not turn off transistor 200. The forward biased internal parasitic diode (indicated by reference numeral 216) allows current flow of the order of milliamps. This results in heating of the cell and possible damage. In back-drive mode, when VDDIO is 0 V, the situation is even worse. The voltage to the source and gate of PMOS 200 is 0 V. This not only turns the transistor 200 on but also provides a voltage drop of 5.5 V across the drain-source junction and gate oxide which can cause irreparable damage.

One proposed prior art solution to reduce the gate oxide and drain-source junction voltages of the driver pull-up and pull-down transistors is to use cascoded p-channel pull-up transistors and cascoded n-channel pull-down transistors in the driver circuit, as shown in FIG. 3, in order to split the voltage across two pull-up and two pull-down transistors. The operation remains the same as for the simple circuit of FIG. 2, since one of the transistors in each cascoded pair is always kept on in normal mode, and the other transistor in each cascoded pair performs the toggling function to accommodate the load on the pad. Thus transistors 300 and 312 are always on during normal mode. It will be noted that even with NMOS transistor 300 asserted, current is prevented from flowing through the NMOS transistors 300, 302 by grounding the gate of transistor 302, which switches transistor 302 off.

However, the need for cascoded transistors results in more IC space being taken. The mobility of carriers in NMOS devices is approximately twice that in PMOS devices. Therefore, in order to maintain similar charge and discharge times for the PMOS pull-up and NMOS pull-down transistors, the PMOS device typically has to be twice the size of the NMOS device. By cascoding the devices, the transistors effectively present series resistances. In order to reduce this resistance effect, the size of the NMOS and PMOS devices is doubled. This provides NMOS devices that are each 2× the size of non-cascoded NMOS devices and PMOS devices that are each 4× the size of non-cascoded NMOS devices. Thus, the solution is costly to implement.

Furthermore, although the cascoding of the transistors splits the voltage, additional circuit elements still need to be introduced to avoid gate oxide breakdown and junction breakdown of the PMOS driver transistors, as well as current to VDDIO and well charging during stress mode. Also, the circuit of FIG. 3 is for protection during 5V tolerant mode. In back-drive mode, since there is no supply voltage, the gate voltages of the driver output transistors are prone to gate oxide damage. Also, to avoid current flow through PMOS transistor 312, the gate of PMOS 312 is charged to the same voltage as its drain. In order to prevent parasitic diode well charging, during back-drive mode and 5V tolerant mode, the floating n-wells of the PMOS transistors 310, 312 are charged up to FW3 and FW5, respectively (the same voltage as their respective drains). The well charging is achieved by adding a PMOS transistor 314 acting as a switch. With the gate of transistor 314 held sufficiently low relative to its source, i.e when the pad voltage is greater than VDDIO by at least a diode drop, the switch is closed and the voltage of the well is brought up to the level of the pad (5.5 V in stress mode). Gate oxide breakdown and current through the PMOS 312 is prevented by including the PMOS transistor 316 acting as a switch which brings up the voltage of the gate of transistor 312 when the gate of transistor 316 is low relative to the pad voltage. However, in addition to the forward biased internal parasitic diode 322, there is a forward biased parasitic diode 320 in transistor 310 and a reverse biased parasitic diode 324. The diode 324 causes leakage current of the order of 10 nA to flow through the diode 324 during back-drive mode. This charges the drain of transistor 310 to 5.5 V which causes gate oxide breakdown and junction breakdown problems for transistor 310.

The present invention seeks enhance the tolerance of an I/O interface to provide tolerance during 5V tolerant as well as back-drive mode.

SUMMARY OF THE INVENTION

The present invention provides a method and circuit for enhancing the tolerance of I/O interfaces to provide tolerance during 5V tolerant as well as back-drive mode.

According to the invention there is provided circuitry to limit the potential difference across the CMOS transistors to avoid oxide breakdown and drain-source junction breakdown and to limit parasitic diode well charging and cut current flow to VDDIO. In particular the invention provides for a bias circuit supplied by a high external voltage, such as the pad voltage, to charge up the floating wells and floating nodes in order to limit the static DC bias potential below the maximum stress level of the CMOS process. Preferably the resultant back-drive circuit comprising the I/O interface with its bias circuit is not only 5.5 V tolerant, but is also back-drive tolerant. Typically the worst case DC current used by the back-drive circuit is less than 10 µA during back-drive mode and 1 µA during normal mode.

The invention provides for a pass gate between the pad and the I/O interface circuitry to isolate the I/O interface circuitry from the pad voltage during stress mode. The pass gate typically includes a PMOS transistor connected in parallel with an NMOS transistor. The PMOS transistor is typically switched off during stress mode while the NMOS transistor provides a reduced voltage to the I/O interface. Preferably the gate of the NMOS transistor is charged to a voltage NG1 of approximately 3 V which ensures a low voltage to the driver output and receiver input under stress mode.

According to the invention, there is provided a method of enhancing the tolerance of an I/O interface to high pad voltages, comprising isolating the pad from the driver output and receiver input by providing a NMOS and a PMOS transistor in parallel between the pad, and the driver output and receiver input.

Further, according to the invention, there is provided circuitry for enhancing the tolerance of an I/O interface driver to high pad voltages during stress mode, a NMOS isolation transistor between the pad and the driver to reduce the pad voltage to a reduced internal voltage that does not exceed the gate oxide and junction breakdown voltages of the transistors of the driver, and a bias circuit supplied by the pad for biasing the gate of at least one pull-up transistor of a driver circuit of the I/O interface to the reduced internal voltage, and for biasing the n-well of said at least one pull-up transistor of the driver circuit to the reduced internal voltage. The circuitry may include a PMOS transistor in parallel with the NMOS transistor to act as a switch that is off during stress mode and on during normal mode. Typically the gates of the NMOS and PMOS transistors are charged during stress mode by a charging circuit to a bias voltage that avoids gate oxide breakdown during stress mode. During stress mode, the gates of the NMOS and PMOS transistors are charged to a level that switches off the PMOS transistor and switches on the NMOS transistor. The charging circuit preferably receives its input voltage from the pad. The stability of the bias voltage from the charging circuit, may be maintained by providing the charging circuit with current paths to ground.

Still further, according to the invention, there is provided circuitry for enhancing the tolerance of an I/O interface to high pad voltages, comprising a NMOS transistor to reduce the high pad voltage to an internal voltage of no more than 3.8 V, and circuitry for charging up floating nodes and floating n-wells of the driver circuit of the I/O interface to the internal voltage. A PMOS transistor may be connected in parallel with the NMOS transistor to act as a switch that is off during stress mode and on during normal mode.

Still further, according to the invention, there is provided a method of reducing the noise being passed from a driver to a load, comprising providing a full pass gate between the driver and the load. The gate of the NMOS transistor of the pass gate is preferably charged up to the supply voltage to prevent gate oxide and junction breakdown. Preferably the NMOS transistor of the pass gate is switched on and the PMOS transistor of the pass gate is switched off during stress mode.

DETAILED DESCRIPTION OF THE INVENTION

Figure 1:
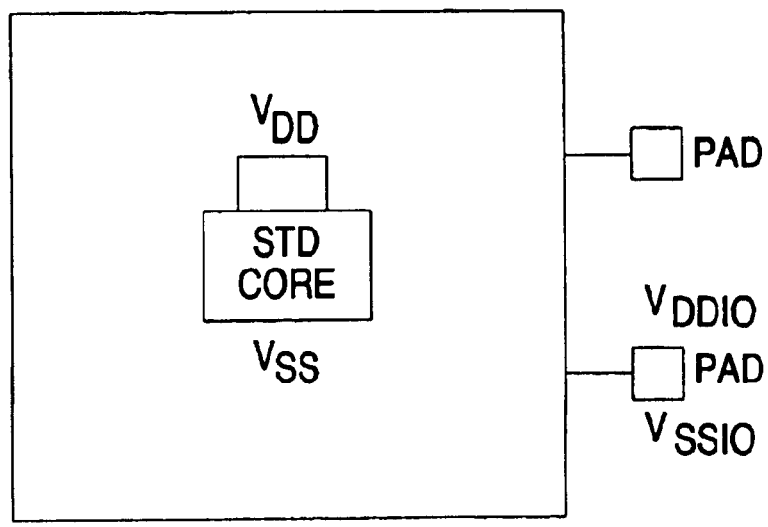
FIG. 1 is a simple representation of a typical prior art integrated circuit device.
Figure 2:
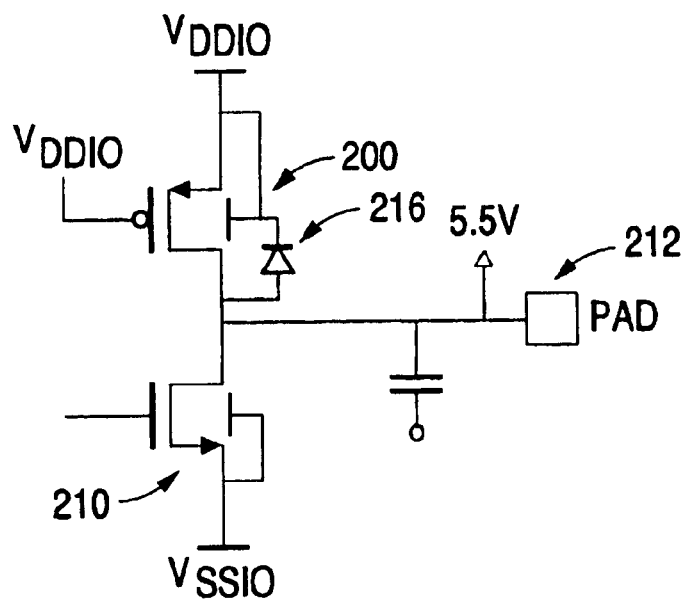
FIG. 2 is a simple prior art pull-up and pull-down structure for a driver circuit.
Figure 3:
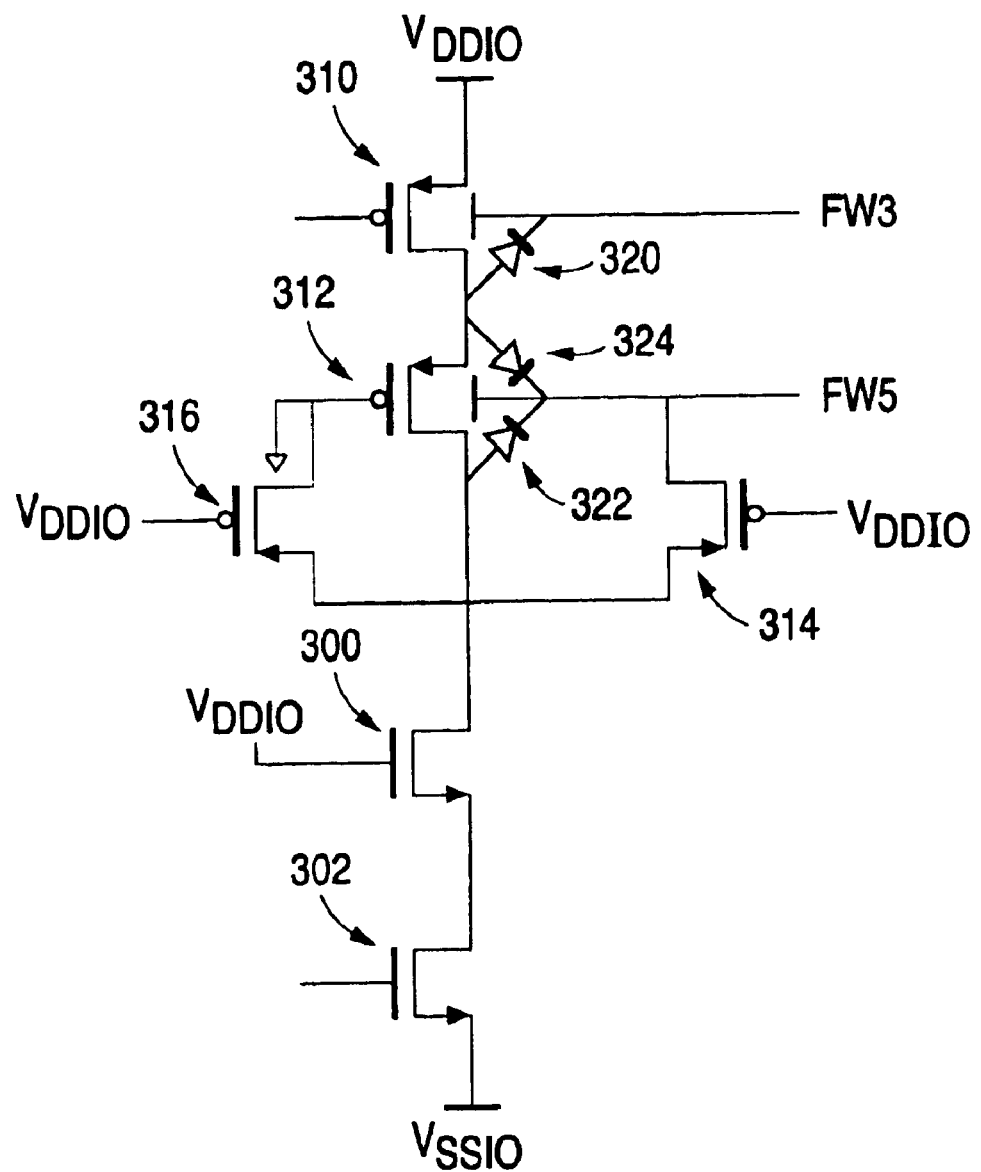
FIG. 3 is another prior art pull-up and pull-down structure for a driver circuit used for 5V tolerant mode.
Figure 4A:
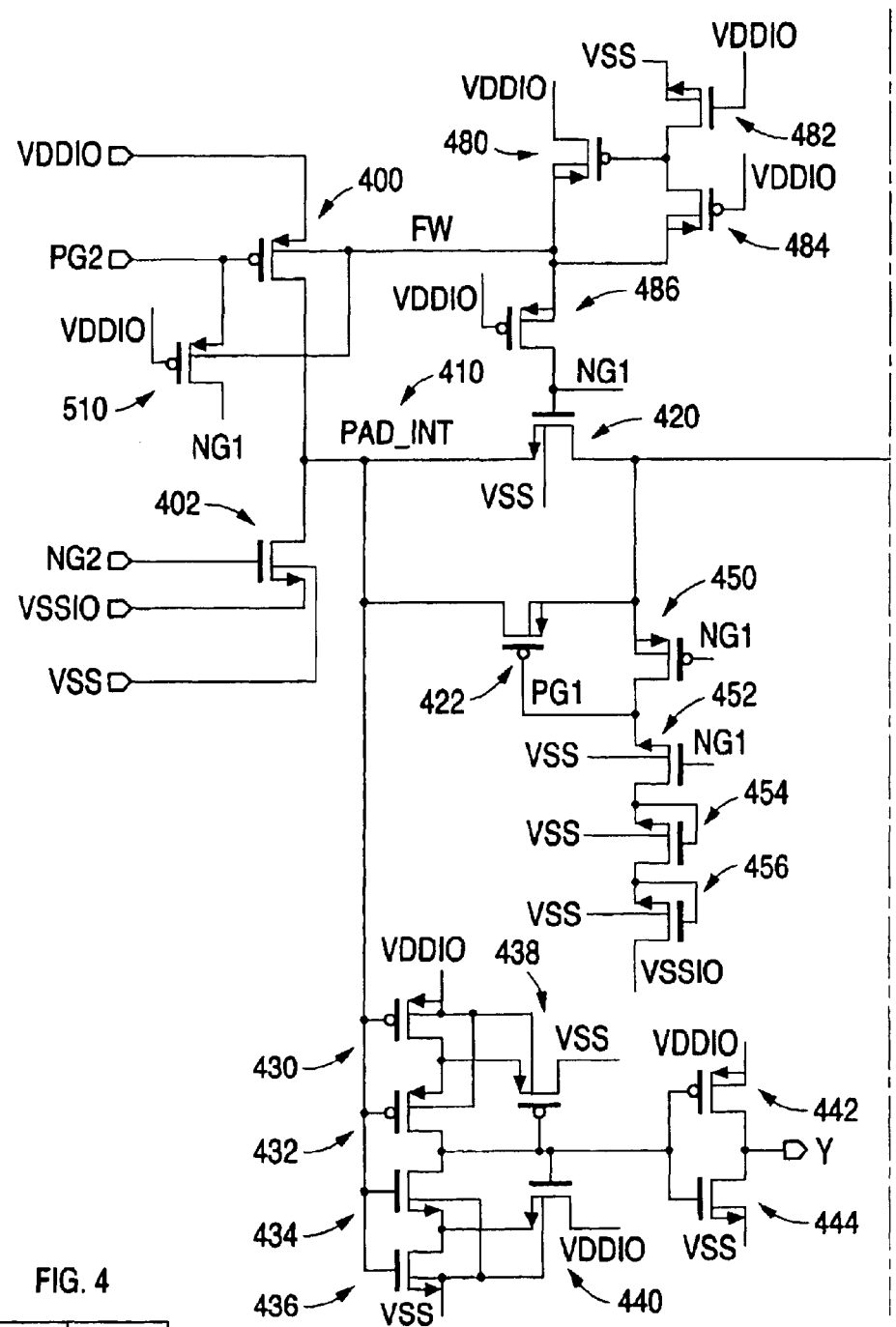
FIG. 4 is a schematic circuit diagram of one embodiment of the invention.
Figure 4A:
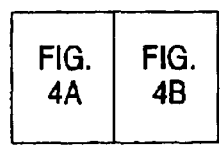
Figure 4B:
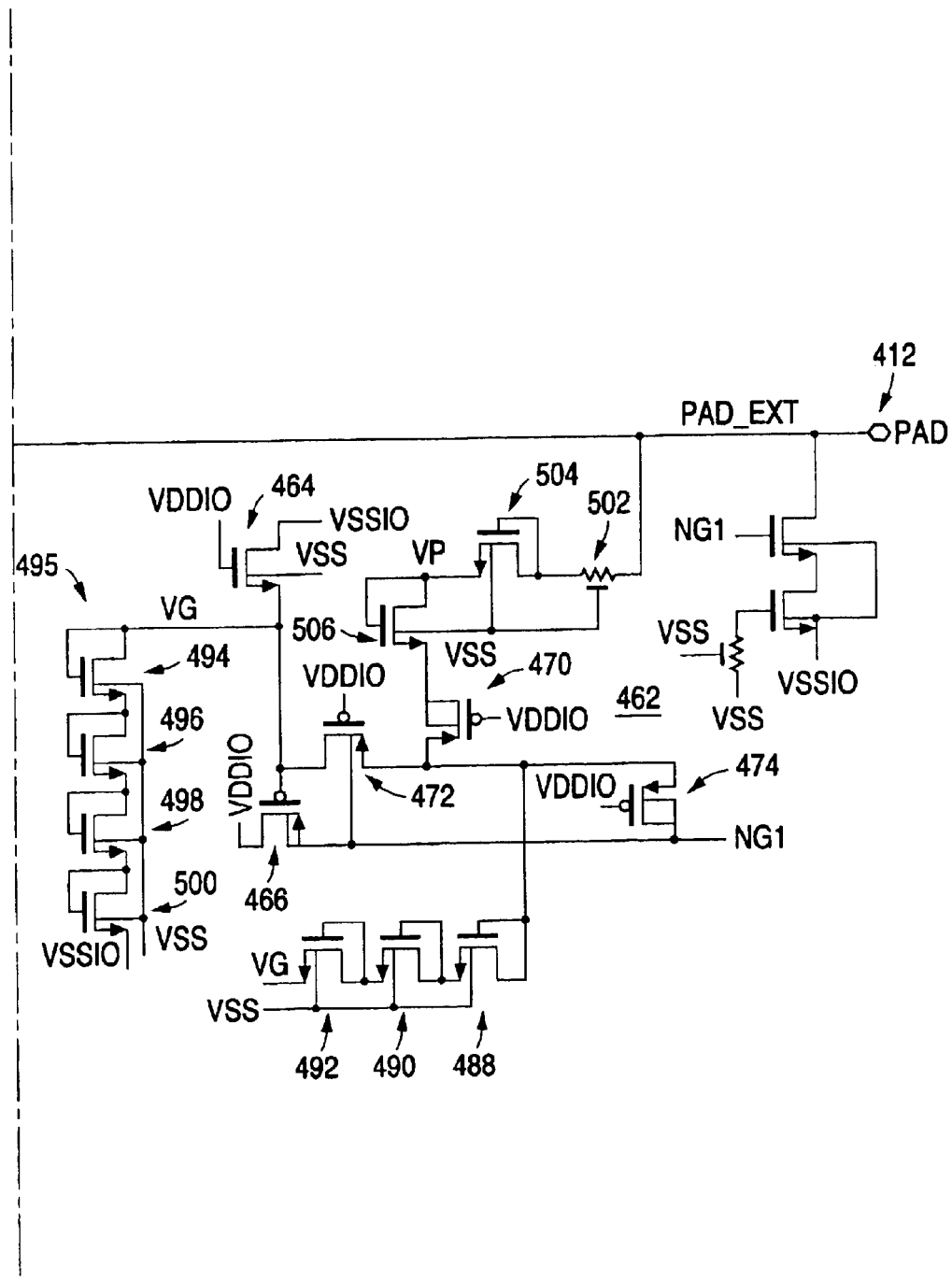

One embodiment of the invention is shown in FIG. 4. The embodiment of FIG. 4 allows the I/O interface driver to be implemented using one PMOS pull-up transistor 400 and one NMOS pull-down transistor 402, while avoiding gate oxide or drain-source junction breakdown of the PMOS transistor 400 during stress mode (5 V tolerant mode or back-drive mode), and avoiding current flow to VDDIO and parasitic well charging of the well of PMOS 400. As shown in FIG. 4, the driver output of the I/O interface includes a PMOS transistor 400 and a NMOS transistor 402 that are connected to an internal node 410 (PAD_INT). The internal node 410 is isolated from the pad 412 (node PAD_EXT) by a pass gate comprising a NMOS transistor 420 and a PMOS transistor 422. By using a non-cascoded driver with only one PMOS and one NMOS transistor, and protecting it against high pad voltages by providing a pass gate between the driver and the pad, the present invention provides the added benefit that it reduces the noise passed from the driver to the load. This may be attributed to the fact that the internal node 410 (PAD_INT) swings rail to rail (between VDDIO and ground), therefore the rise time and fall time are longer compared to a cascoded driver where the drains of the first PMOS pull-up and first NMOS pull-down do not swing rail to rail. Hence, for the same size driver (PMOS and NMOS) with the same driving current, the di/dt will be reduced since dt (rise and fall time) is increased. This smaller di/dt corresponds to less noise.

The receiver input, in turn, comprises the transistors 430, 432, 434, 436, 438, 440, 442, and 444.

Under normal operation, PAD_EXT has to be connected to PAD_INT in order to allow signals to pass both from the driver output, as well as to the receiver input, from the pad 412 without loss of integrity. For this reason a full pass gate that includes the PMOS transistor 422 is provided. As is discussed in greater detail below, the PMOS transistor is off during stress mode but on during normal mode. Thus, it compensates for the diode drop across the NMOS transistor 420 during normal mode.

The present invention arranges the circuitry to switch both of the transistors 420, 422 of the pass gate on during normal mode. PMOS transistor 422 requires a low gate voltage to switch on, which is achieved by switching transistor 450 off and transistors 452, 454, 456 on, thereby connecting the gate of transistor 422 to VSSIO. NMOS transistors 452, 454, 456 are switched on to provide a path to ground, thereby ensuring that PMOS 422 is on. NG1 is derived from the bias circuit, which is indicated generally by reference numeral 462. Under normal mode (where the pad is driven by the driver output to lie between 0 and 3.6 V) transistor 464 of the bias circuit 462 turns on to cause the gate of transistor 466 to go low and turn on transistor 466. This, in turn charges NG1 to VDDIO potential. The current path through transistor 466 is ensured since the other PMOS transistors 470, 472, 474 in the bias circuit are turned off (gates high relative to their drains or sources.)

Furthermore, the floating n-well of the driver PMOS transistor 400 is charged to VDDIO through transistor 480, which is on since its gate is at ground (NMOS transistor 482 is on and PMOS transistor 484 is off).

Thus this embodiment of the invention works under normal mode. The two stress modes will now be considered in turn.

Under 5 V tolerant mode the pad 412 is raised to 5.5 V, while the supplies (both VDD and VDDIO) are asserted. As in the case of normal mode, transistor 466 of the bias circuit 462 charges NG1 to VDDIO=3.3 V. Transistors 470, 472, 474 are again turned off. In order to ensure that transistors 472 and 474 are off, a current path is provided via transistors 488, 490, 492 (VG from node 495 is at VSSIO during 5 V tolerant mode, since transistor 464 is on.

A significant feature of setting NG1 to VDDIO is that it ensures that the maximum gate to source/drain junction voltages of pass gate transistor 420, 422, and transistors 450, 452 are not exceeded (even though the drain/source is at 5.5 V, the gate is at 3.3 V which keeps the junction voltage sufficiently low).

The receiver input and driver output are connected to PAD_INT and are isolated from PAD_EXT by the pass gate transistors, 420, 422. PMOS transistor 422 is off since its gate is high (transistor 450 is on which provides a high voltage to the gate of transistor 422). The NMOS transistor 420, in turn, has its gate at VDDIO and therefore provides node 410 (PAD_INT) with a voltage that is approximately VDDIO.

As in the case of normal mode, the n-well of PMOS 400 (FW) is charged to VDDIO since transistor 482 is on, which turns on transistor 480. The gate of transistor 480 is isolated from FW since transistor 484 is off.

No current flows through the PMOS driver transistor 400 since PG2 is charged to VDDIO, thereby switching off transistor 400.

Thus the present embodiment provides for a full pass gate and a bias circuit to set the internal node and floating n-well voltages to protect them during 5 V tolerant mode.

During back-drive mode the supplies are not asserted and the pad 412 is raised to 5.5 V. During back-drive mode the bias circuit 462 for NG1 takes its biasing current from the pad itself (in contrast to 5V tolerant mode, which took the biasing current from VDDIO). The bias current passes through the resistor 502 and the diode-connected transistors 504, 506, which drop the pad voltage to about 3 V. Since VDDIO is at 0 V in this mode, transistors 470, 472 are switched on, which charges NG1 to about 3 V. With transistor 472 turned on, the gate of transistor 466 goes high, switching transistor 466 off. A current path is provided by transistors 494, 496, 498, 500, since the VG node is now at about 3 V, which places the gates, drains and sources of diode-connected transistors 488, 490, 492 at about the same voltages to eliminate these diode-connected transistors as a current path. Also, transistor 466 is turned off. Hence there is no current path to VDDIO.

With NG1 at about 3 V, the gate of pass gate transistor 420 is set to 3V and the gate of transistor 422 is set to 5.5 V. PMOS transistor 422 thus switches off to isolate PAD_INT from PAD_EXT. The maximum voltage at the node 410 (PAD_INT) is determined by the NMOS transistor 420 which is on and provides a voltage at its source of NG1.

Also, the junction voltages of the transistors 450, 452 are kept below the critical oxide breakdown level of about 3.8 V since their gate voltages are at about 3 V.

Furthermore, the gate of PMOS driver transistor 400 and its n-well are charged to NG1 which avoids the flow of current into the well and also switches transistor 400 off to avoid current flow to VDDIO. (The n-well of transistor 400 is charged to about 3 V since transistor 480 is off and transistor 486 is on. The gate of transistor 400 is charged to about 3 V through transistor 510 which is on an connected to NG1).

Although the present invention has been described with reference to a particular embodiment, it will be appreciated that it can be implemented in different ways to avoid gate oxide breakdown and parasitic diode charging of the wells of the driver transistors, without detracting from the scope of the invention. Also, while NG1 in the back-drive mode has been defined as being about 3 V, it will be appreciated that process, temperature, and supply voltage variations can cause NG1 to vary between about 2.7 V and 3.5 V.

What is claimed is:

1. Circuitry for enhancing the high pad voltage tolerance of an I/O interface driver during stress mode, comprising a NMOS isolation transistor between the pad and the driver to reduce the pad voltage to a reduced internal voltage that does not exceed the gate oxide and junction breakdown voltages of the transistors of the driver, and a bias circuit supplied by the pad for biasing the gate of a pull-up transistor of a driver circuit of the I/O interface to the reduced internal voltage during back-drive mode, and for biasing the n-well of the pull-up transistor of the driver circuit to the reduced internal voltage.

2. Circuitry of claim 1, further comprising a PMOS transistor in parallel with the NMOS transistor.

3. Circuitry of claim 2, wherein the gate of the NMOS transistor is charged during stress mode by a first charging circuit to a bias voltage that avoids gate oxide breakdown during stress mode.

4. Circuitry of claim 3, wherein the first charging circuit receives its input voltage from the pad.

5. Circuitry of claim 4, wherein the stability of the bias voltage from the first charging circuit, is maintained by providing the first charging circuit with current paths to ground.

6. Circuitry of claim 3, wherein the gate of the PMOS transistor is charged during stress mode by a second charging circuit to a bias voltage that avoids gate oxide breakdown during stress mode.

7. Circuitry of claim 6, wherein the second charging circuit receives its input voltage from the pad.

8. Circuitry of claim 7, wherein the stability of the bias voltage from the second charging circuit, is maintained by providing the charging circuit with a current path to ground.

9. Circuitry of claim 6 wherein the first and second charging circuits include at least part of the bias circuit.

10. Circuitry for enhancing the tolerance of an I/O interface driver to high pad voltages, comprising a NMOS transistor connected between the pad and the I/O interface to reduce the high pad voltage to an internal voltage of no more than transistor gate oxide or junction breakdown voltage, and a bias circuit for charging up the gate of the NMOS transistor, and a gate and a n-well of a pull-up transistor of the I/O interface driver during high pad voltages, to the level of the internal voltage.

11. Circuitry of claim 9, further comprising a PMOS transistor connected in parallel with the NMOS transistor, and a switching circuit for switching off the PMOS transistor during stress mode and on during normal mode.

12. Circuitry of claim 11, wherein the bias circuit receives its input voltage from the pad.

13. Circuitry of claim 12, wherein the stability of the bias voltage from the bias circuit, is maintained by providing the bias circuit with a current path to ground.

14. Circuitry of claim 11, wherein during stress mode the switching circuit charges the gate of the PMOS transistor to a bias voltage that avoids gate oxide breakdown.

15. Circuitry of claim 12, wherein the switching circuit includes inputs from the bias circuit.

* * * * *